(12) United States Patent
Shvets et al.

(10) Patent No.: US 6,419,752 B1
(45) Date of Patent: Jul. 16, 2002

(54) STRUCTURING DEVICE FOR PROCESSING A SUBSTRATE

(75) Inventors: Igor V. Shvets, Dublin (IE); Ivajlo W. Rangelow, Baunatal (DE); Peter Güthner, Taunusstein (DE); Jens Voight, Fuldatal (DE); Guido Mariotto, Dublin (IE); Hans Löschner, Vienna (AT)

(73) Assignees: The Provost, Fellows and Scholars of the College of the Holy and Undivided Trinity of Queen Elizabeth near Dublin, Dublin (IE); Universitate Gesamthochshule Kassel, Kassel (DE); IMS-Ionen Mikrofabrikations Systeme GmbH, Vienna (AT)

( * ) Notice: Subject to any disclaimer, the term of this patent is extended or adjusted under 35 U.S.C. 154(b) by 0 days.

(21) Appl. No.: 09/399,303

(22) Filed: Sep. 17, 1999

(30) Foreign Application Priority Data

Sep. 18, 1998 (AT) .......................................... A1567/98
May 31, 1999 (AT) ............................................ A964/99

(51) Int. Cl.$^7$ ............................................. C23C 16/00
(52) U.S. Cl. ................... 118/720; 118/715; 118/723 R; 118/723 E; 118/723 IR; 118/723 ER; 118/723 MR; 118/500; 118/504; 156/345
(58) Field of Search ....................... 118/723 R, 723 FE, 118/723 FI, 723 MR, 723 MA, 723 E, 720, 721, 723 ER, 723 IR, 715, 500, 504; 156/345

(56) References Cited

U.S. PATENT DOCUMENTS

| | | | | |
|---|---|---|---|---|
| 4,851,097 A | * | 7/1989 | Hattori et al. ......... | 204/192.33 |
| 4,967,088 A | * | 10/1990 | Stengl et al. ............ | 250/491.1 |
| 5,376,224 A | * | 12/1994 | Zarowin ..................... | 156/345 |
| 5,827,435 A | * | 10/1998 | Samukawa ................... | 216/69 |
| 5,996,528 A | * | 12/1999 | Berrian et al. .......... | 118/723 E |
| 6,019,848 A | * | 2/2000 | Frankel et al. ............. | 118/715 |
| 6,039,834 A | * | 3/2000 | Tanaka et al. .............. | 156/345 |
| 6,159,388 A | * | 12/2000 | Yanagisawa et al. ........ | 216/60 |
| 2001/0032705 A1 | * | 10/2001 | Sadohara et al. .......... | 156/345 |

* cited by examiner

Primary Examiner—Jeffrie R. Lund
(74) Attorney, Agent, or Firm—Welsh & Katz, Ltd.

(57) ABSTRACT

A structuring device (SD) for processing a surface of a substrate (SB), comprising a substrate chamber (VC) for mounting the substrate (SB) and a reaction chamber (GC) enabling a gas reaction at a given operating pressure. The reaction chamber (GC) has at least one gas inlet (GL) for a reaction gas and at least one injection outlet (JL) leading into the substrate chamber, while the substrate chamber (VC) is provided with a pumping system (PP) for maintaining a vacuum within the substrate chamber at a pressure not above the operating pressure of the gas reaction in the reaction chamber (GC). The injection outlet (JL) is provided with at least one injection pipe ending into an injection opening of given width, the injection pipe having a length not smaller than the width of the injection opening, the injection pipe forming the gas particles originating from the gas reaction into a gas jet streaming out of the injection opening. For controlling the distance between the injection opening and the substrate surface (SB) at a height of the order of or below the width of the opening as measured along the axis of the injection pipe, the injection outlet and/or the substrate are provided with a positioning means (NP,SP).

19 Claims, 6 Drawing Sheets

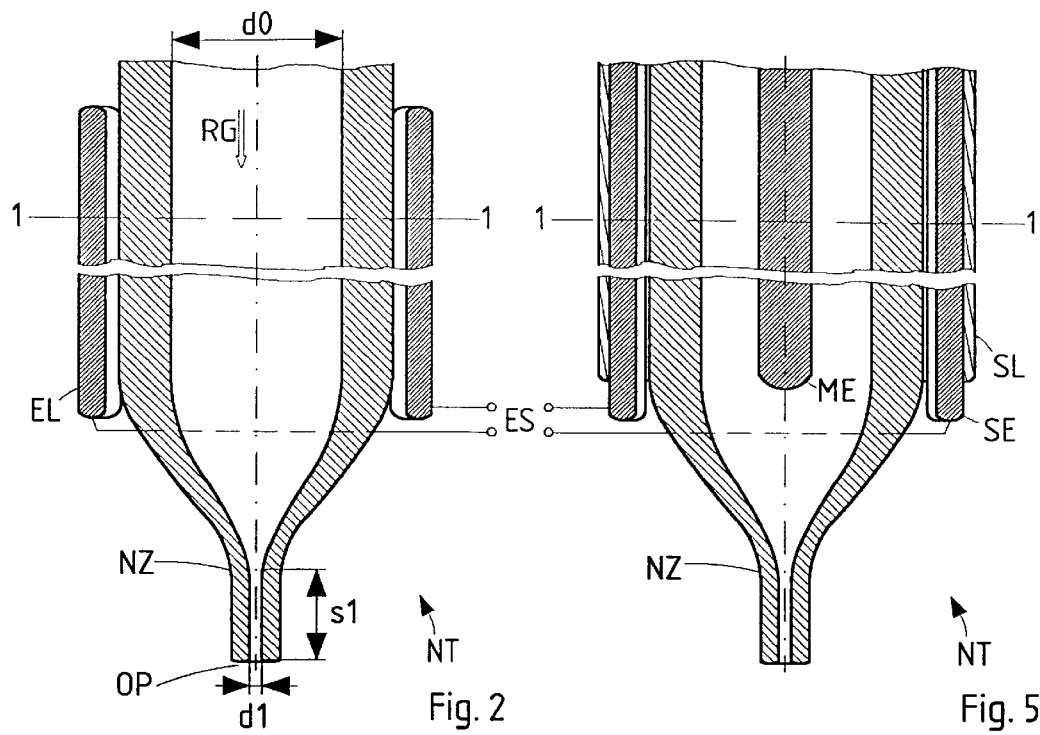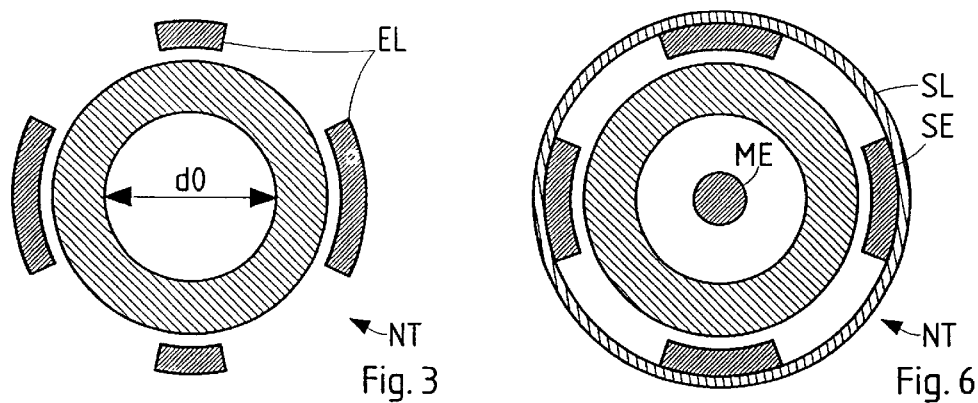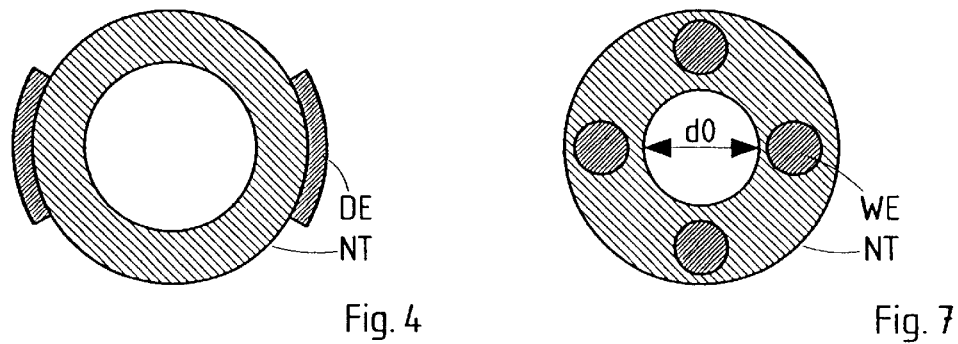
Fig. 2  Fig. 5  Fig. 3  Fig. 6  Fig. 4  Fig. 7

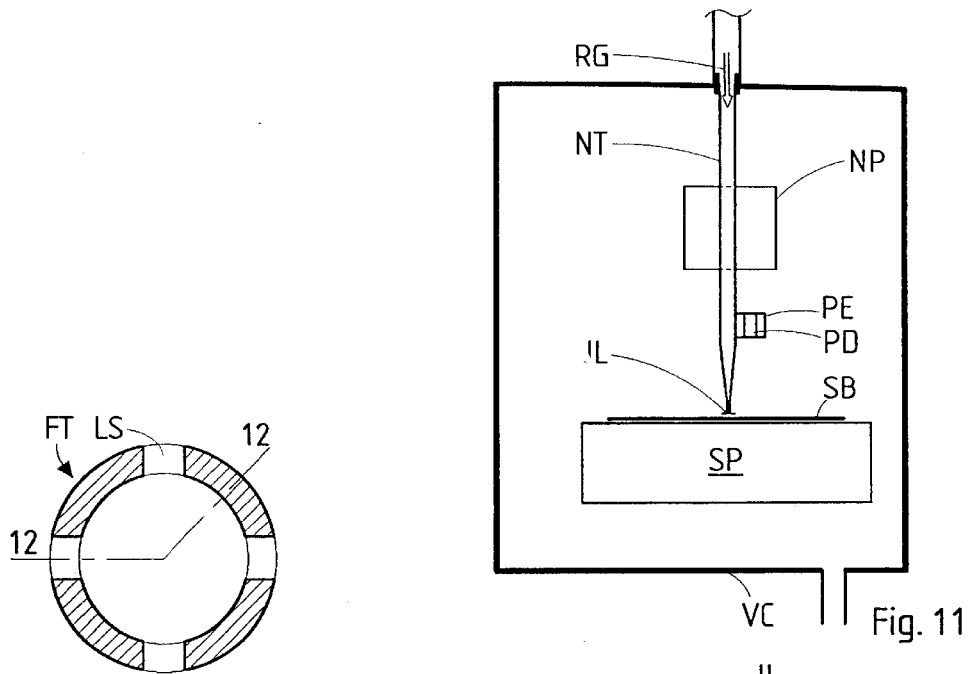
Fig. 11
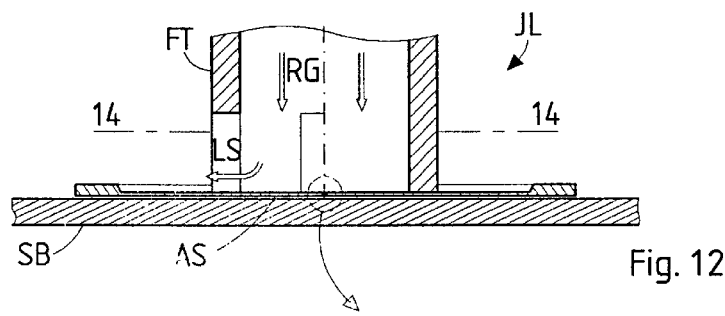
Fig. 12
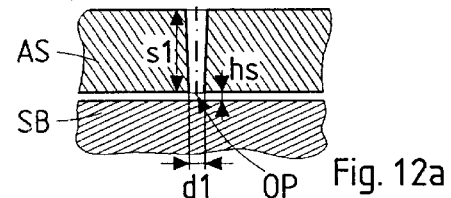
Fig. 12a
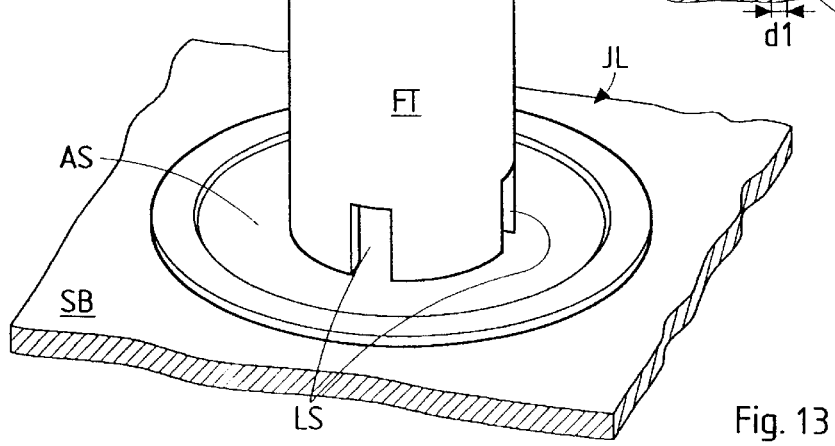
Fig. 13
Fig. 14

STRUCTURING DEVICE FOR PROCESSING A SUBSTRATE

FIELD OF THE INVENTION AND DESCRIPTION OF PRIOR ART

This invention refers to plasma structuring of a substrate surface.

To be more specific, this invention relates to a structuring device for processing a surface of a substrate, comprising a substrate chamber for mounting the substrate and a reaction chamber enabling a gas reaction at a given operating pressure, the reaction chamber having at least one gas inlet for a reaction gas and at least one injection outlet leading into the substrate chamber.

A plasma etching device of this type was proposed by Larson et al. in J. Vac. Sci. Technol. B, Vol. 10 (1992), p. 27. In this device, a glass tube widens to an expansion serving as plasma chamber, tapers back and then performs a V-shaped bend. The etchant gases enter the etching device by way of the inlet of the tube, flow through the larger plasma chamber where a radio-frequency plasma discharge is maintained, continue downstream past the vertex of the V, and are pumped off through the outlet of the tube. At the vertex an aperture is made in the thinned tubing wall. Below the aperture the substrate is positioned on a base which, in the embodiment used by Larson et al., is the upper face of a waveguide used for monitoring and which, together with the tubing wall around the aperture and vacuum-sealed by means of an O-ring, forms an etching chamber enclosing the substrate. By this etching method, it is possible to achieve a spatially confined etch process as defined by the shape of the perimeter of the etching chamber. However, this approach does not allow for high-resolution etching or simultaneous imaging during the etch. The shaping of the etching chamber defines the smallest size of the features which can be fabricated using this method. Since the size of the chamber cannot be easily made small, this method is not well suited for making structures in the micrometer and submicrometer-size range.

Structuring of features in the micrometer range and below, so-called microfabrication, is used in various fields of technology such as electronics, sensorics, integrated optics, micro-actuators, and micro-acoustic devices. Structuring here means the creating of a desired spatial pattern on the substrate surface, and comprises material processing such as removing, e.g. etching; growing, e.g. deposition; and other ways of treatment of material, e.g. doping or chemical transformation.

With regard to etching at present time, dry etching in a weakly ionized high-density plasma is most commonly used; plasma methods are also applicable for deposition processes. The benefit of plasma etching is that it allows for anisotropy, i.e. a high directionality where the material is removed preferentially along a certain crystallographic direction on the substrate. The material to be etched is chemically converted into a volatile phase which is pumped off. It is to be noted that by changing the gas composition, it is possible to switch from etching to deposition of new material straightaway.

At present, commercial microfabrication requires a combination of different methods for deposition of photo-resist, writing the required micro-patterns in the resist, and transferring the pattern from the resist into the substrate by etching of the resist and subsequent processing of the substrate. Lithographic methods are, for instance, discussed in 'semiconductor Fabtech', ed. M. J. Osborne, $7^{th}$ edition, 1998, ICG Publishing Ltd., London. The lithographic methods are indirect in a sense that the desired structures are first defined in a layer deposited only temporarily and then transferred from this layer to the substrate. Therefore, microfabrication by lithographic procedure involves a plurality of steps making the complete process complex and expensive. Features as small as 200 nm can be fabricated using optical lithography, and structures with features down to 100 nm can be fabricated using particle-beam or X-ray lithography. As the size of the features continues to shrink, the equipment required for microfabrication rapidly becomes more and more expensive with respect to cost of ownership and maintenance of the complex line.

Alternative methods to lithography use direct structuring of the substrate. One direct etching arrangement for high-resolution microfabrication is the focused ion beam (FIB) technique which allows microfabrication by vector scan of the ion beam. The FIB technique, however, is very cost intensive. Also known is the combination of FIB microfabrication and in-situ analysis by scanning electron microcopy (SEM). This combination technology proved highly valuable for failure analysis and prototype development; however, its high cost and complexity are prohibitive for most commercial applications. Instead of ions, electrons can also be used for electron-beam structuring methods. It is to be noted that these structuring methods involve using a particle-beam rather than a plasma gas. One well-known complication of using particle beams is defects introduced into the substrate by the impact and/or implantation of high-energy particles.

Also known is a flow injection system for delivering a liquid etchant onto a surface and monitoring the chemical processes by means of scanning tunneling microscopy using the delivering syringe as scanning probe, as disclosed by Noll et al., in Rev. Sci. Instrum. Vol. 66 (1995), p. 4150. This system, however, relates to the investigation of chemical and electrochemical processes; due to the surface tension, the etchant liquid will spread over a large area on the substrate and prevent successful manufacturing of small-size structures.

Another method of structuring, called "hot-jet etching" is described by Geis et al., in J. Vac. Sci. Technol. B 4, 315–317 and J. Vac. Sci. Technol. B 5, 363–365. There, a stream of reactive gas is produced by means of a heated jet nozzle and directed toward a substrate. The reactive gas species of the stream are generated by thermal dissociation. The distance between the nozzle outlet and the substrate is chosen so that the entire substrate area is covered by the gas stream. In the setup of Geis et al., this distance is approximately 10 cm, which corresponds to the dimension of the wafer used as substrate. In order to achieve a structuring of the etching process, Geis et al. mainly use photoresist masks, but also propose to employ stencil masks positioned above the surface of the substrate to be processed. Thus, the production of the reactive gas stream and determination of the etch pattern are determined by separate devices, and thus the hot-jet etching method employs indirect structuring as well, like indirect lithography. Therefore, it requires pre-structuring of the mask layer or the stencil mask and brings about the disadvantages as discussed above.

SUMMARY OF THE INVENTION

It is an aim of this invention to develop a novel, inexpensive technology for direct microfabrication by etching of the substrate surface in the micrometer range and below, based on direct structuring of surfaces using plasma. As a further aim, the technology should allow for local growth and chemical modifying of material on the surfaces. Moreover, structuring shall be possible without introducing damages from the particles applied. It is a further aim of the invention to allow for simultaneous microfabrication and imaging.

These aims are achieved by a structuring device as mentioned at the beginning wherein (see, e.g., FIG. 11) the substrate chamber VC is provided with a pumping system PP for maintaining a vacuum within the substrate chamber at a pressure not above the operating pressure of the gas reaction in the reaction chamber GC, the injection outlet JL is provided with at least one injection pipe ending into an injection opening OP of given width d1, the injection pipe having a length s1 not smaller than the width d1 of the injection opening, the injection pipe forming the gas particles originating from the gas reaction into a gas jet streaming out of the injection opening OP, and the injection outlet JL and/or the substrate SB are provided with a positioning means NP,SP for positioning the injection opening with respect to the substrate surface at a height of the order of or below the width of the opening as measured along the axis of the injection pipe.

This solution offers a simple and low-cost way to perform direct microstructuring. The injection opening forms the gas jet and thus directly determines the size and shape of the area etched or deposited to at any time, thus determining the size of the smallest features which can be fabricated using this method. Only the area directly in the vicinity of the opening is being processed, whereas the other areas of the sample are not affected. Another advantage is the low landing energy of the reactive particles at the substrate surface, determined by the thermal energy of the particles, i.e. in the order of 0.1 eV, limiting the detrimental effects to the surface and thus avoiding damage at the substrate. Whenever reference is made to the width of the injection opening or injection pipe, this refers the cross-sectional dimension of the opening or pipe.

The possibility of combining in one device both removing and depositing of material, by changing the composition of the gas used, offers a wide field of applications. They range from the production of integrated elements and micro-devices to the repair of surfaces or membranes such as stencil masks used in lithography, including the removal of particles or other contaminations and growth of bridges. Substrates which can be processed by structuring according to the invention are inorganic materials, e.g. metals such as aluminum or tungsten, semiconductors such as silicon; organic materials, e.g. polymers; and combinations of these materials, e.g. composite materials and integrated circuit devices. Especially if processing small structures with composition varying spatially the combination of surface treatment and imaging proves to be particularly helpful. One example of surface structuring of organic or semiconductor materials is the fabrication of molds in imprint patterns used e.g. in the production of CD disks, by means of mechanical nano-imprint technology as discussed by Chou et al., in Appl. Phys. Lett. Vol. 67 (1995), p. 3114. Another possible application is the manipulation of biological targets, such as single cells.

A preferred embodiment of the invention presented comprises a shield means AS positioned at the injection outlet and at least one injection pipe traversing the shield means. This facilitates production, replacement and maintenance of the device bearing the injection pipe. The shield means can be, for instance a patterned membrane mounted at the opening of the injection outlet.

The shield means can be positioned at a predefined distance from the substrate. Alternatively, in structuring setups where it ;s compatible with the structuring requirements, it may be favorable if the shield means is positionable by means of the positioning means at contact with the substrate.

In a preferred embodiment of the structuring device according to the invention (see, e.g., FIG. 1), which is in particular suitable for the microstructuring purposes described above and in which the size and shape of the injection opening are imaged by the gas jet onto the substrate to be structured, making it possible to process a delimited area of the substrate only, the at least one injection outlet leads through an injection opening OP into the substrate chamber VC, the injection opening OP is positioned at the end of an injection pipe having a length s1 greater than the diameter d1 of the injection opening OP, the injection pipe forming the gas particles originating from the gas reaction into a gas jet streaming out of the injection opening OP, and the injection outlet and/or the substrate are provided with a positioning means NP,SP for controlling the distance between the injection opening and the substrate surface at a height of the order of or below the diameter d1 of the opening as measured along the axis of the injection pipe.

It is further advantageous when the injection outlet or the shield means comprises at least one projecting nozzle NZ through which the at least one injection opening OP emerges. This ensures that there is sufficient space below the shield means so as to allow the volatile products of the processing of the substrate to escape freely in order to be pumped off. Moreover, this simplifies the lateral positioning of the injection opening with respect to the substrate. In particular, the injection outlet may be a tube NT terminating in a tapering end forming a nozzle NZ through which the injection opening emerges.

In order to sustain a plasma discharge in the tube or a given part of the tube, the injection outlet, in particular the projecting nozzle just mentioned, can additionally be provided with at least one electrode, e.g. two or four electrodes, for producing an electro-magnetic field inside the tube.

Furthermore, the injection outlet may comprise at least one escape opening leading into the substrate chamber away from the substrate. This makes it possible to run a continuous gas discharge, which can potentially give rise to a high gas flux, in order to maintain the discharge process in the reaction chamber, even if the required etchant gas flux through the injection pipe is very low, or if with varying injection geometries the amount of gas flux needed varies.

Furthermore it is advantageous if the length s1 of the injection pipe is greater than the injection opening width d1 by a ratio of at least 5:1 (see, e.g., FIGS. 2 and 12a). This allows creating a well-defined area of processing on the substrate for a distance between the injection opening and the substrate surface as large as the width of the opening.

Preferably the reaction chamber is a plasma reaction chamber equipped for sustaining a plasma discharge. Using a plasma reaction allows for the implementation of a wide array of processes for structuring applications. Advantageously, if e.g. surface processing is desired using a short-lived gas species or species which are difficult to store in gaseous form, these gas species can be produced in the course of a gas reaction in the reaction chamber, and thus the gas jet contains chemically active particles produced by the gas or plasma reaction from the at least one reaction gas.

In another preferred embodiment of the invention, the injection outlet and/or the substrate may be provided with a scanning means for scanning the injection opening relative to the substrate over the substrate surface. This makes a sequential microfabrication process possible, in which the substrate surface is being processed area by area, and therefore allows for imaging or writing of structures over an area of the substrate which is far greater than the width of the injection opening. It also allows for imaging the sample surface using the injection opening. The scanning means can be a device separate from the positioning means for control of the distance between the injection opening and the substrate, but advantageously these two functions will be integrated into one position control assembly.

Advantageously the positioning means is realized as a surface scanning microscope, e.g. atomic-force or shear-force scanning microscope, using the injection opening (or a nozzle) as a scanning probe. This provides for the simultaneous microfabrication and imaging with high resolution, thus yielding a highly efficient way to control processing, like for instance for in-situ analysis of the cross-sections of microdevices.

For an efficient operation of the emitted gas jet and removal of the products of structuring, e.g. etching products, the pumping system favorably maintains the vacuum in the substrate chamber at a pressure below the operating pressure of the gas reaction in the reaction chamber by at least one order of magnitude.

In another embodiment of the invention the gas reaction is pulsed. By using a non-continuous reactive gas stream, it is possible to modulate the surface processing, e.g. for short-lived species or for products of extremely low volatility.

A pulsed production of reactive gas also offers the possibility to use the processing pauses for other processing operations, such as positioning and imaging of the sample. This variant is especially useful when a nozzle is used as a probe of a scanning probe microscope.

In a further variant to the invention, the shape and/or the number of the injection opening(s) is formed according to the desired structure(s) to be formed. This allows for printing of structures onto the substrate, thus giving a reduction in processing time.

In another variant of the invention the reaction chamber is located inside the substrate chamber. This may lead to a simpler set-up of the structuring device, depending on the types of the gases and the gas reaction used, and ensures that, e.g. in the case of a rupture of the injection outlet, the reactive species produced in the reaction chamber can only arrive at the vacuum chamber, whence they are pumped off and disposed safely.

For applications where it is favorable that only a small portion of the substrate is exposed to vacuum conditions, the substrate chamber of the structuring device may be provided with an opening adapted to be covered by the substrate being mounted outside the substrate chamber. Thus only the region of the substrate covering the opening is exposed to the vacuum of the substrate chamber. For ensuring free movement of the substrate under the opening, advantageously the opening of the substrate chamber is provided with a positioning means to position the substrate to maintain a predetermined gap width between the substrate surface and said opening, and said opening is further provided with at least one surrounding sleeve provided for being pumped off to a pressure intermediate between the pressure within the substrate chamber and the ambient pressure surrounding the substrate.

For producing a nozzle for the structuring device according to the invention, one suitable method starts from a doped monocrystalline silicon wafer and comprises the following steps (see FIG. 19):

(a) etching of at least one defined window in the front side of said wafer to predetermined crystallographic planes, forming at least one pyramidal hole or elevation PH,PY, (b) generating a stop layer DP of predetermined thickness on the front side of said wafer by diffusion using a dopant of opposite doping type with respect to the bulk of said wafer, (c) electrochemical wet etching of the back side of said wafer to said stop layer, (d) forming an aperture through the tip of the pyramidal hole or elevation.

BRIEF DESCRIPTION OF THE DRAWINGS

The invention is discussed below in detail referring to preferred embodiments of the invention and some variants as displayed in the figures. The figures show:

FIG. 2 a nozzle tube with electrodes in a longitudinal section;

FIG. 3 a cross-section of the tube shown in FIG. 2 along the line 1;

FIG. 4 a cross-section of a glass-tube with electrodes placed directly on the tube surface;

FIG. 5 another variant of a nozzle tube with a central electrode;

FIG. 6 a cross-section of the tube shown in FIG. 5 along the line 1;

FIG. 7 a cross-section of a glass-tube with incorporated electrodes;

FIG. 11 the setup of the vacuum reaction chamber of a third embodiment of the invention;

FIGS. 12 and 13 a longitudinal section and a perspective view of the injection outlet, positioned over the substrate, of the embodiment of FIG. 11 (the planes of the longitudinal section are denoted by line 12 in FIG. 14), and FIG. 12a an enlarged cross-sectional detail of FIG. 12 showing the injection pipe;

FIG. 14 a cross-section of the gas-feed tube of the injection outlet of FIGS. 12 and 13 (the plane of the cross-section is denoted by line 14 in FIG. 12);

It should be noted, however, that the invention is not restricted to the example(s) shown in the figures and dis-

DETAILED DESCRIPTION OF THE INVENTION

Figure 1:
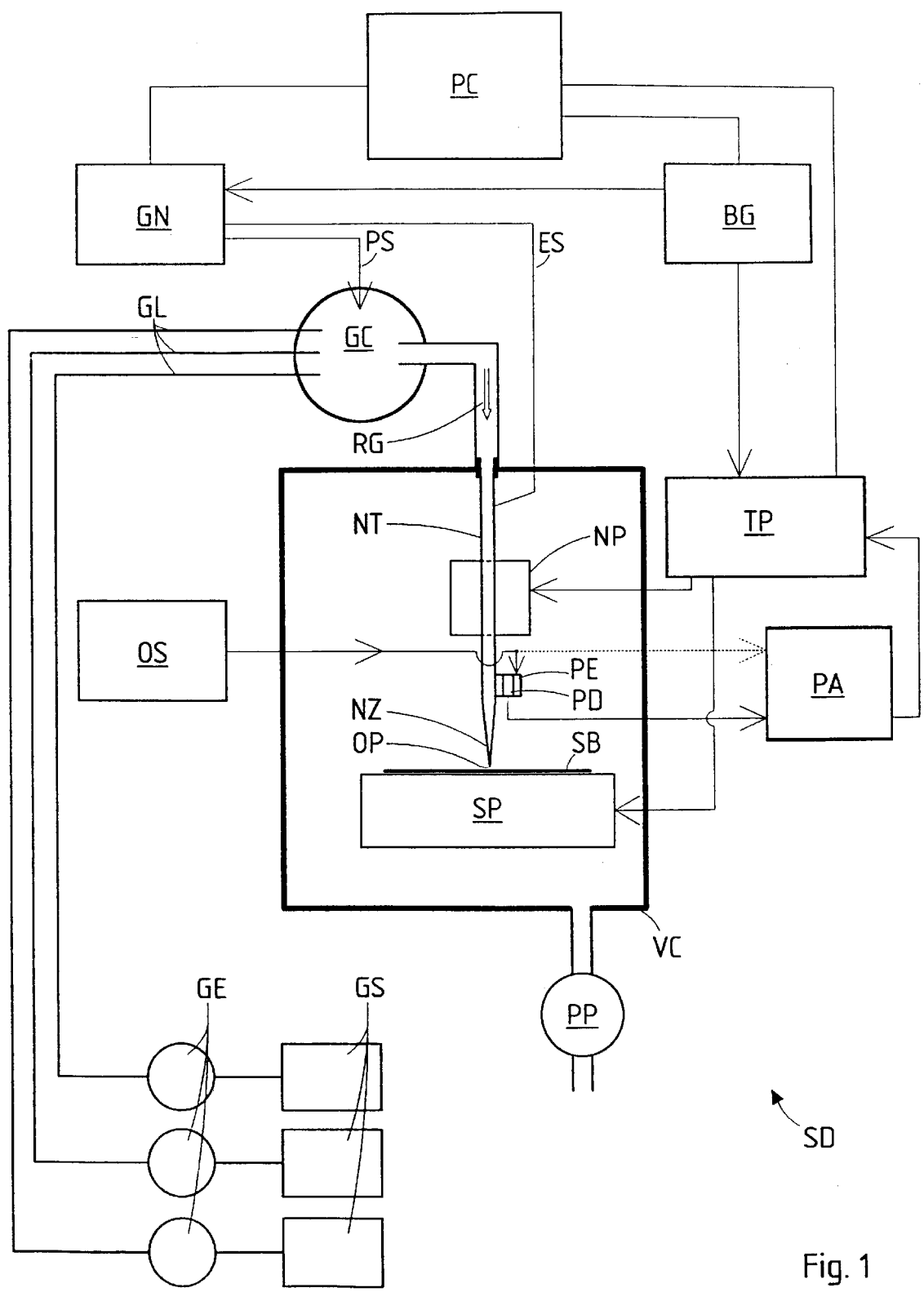
FIG. 1 a schematic layout of a first embodiment of a structuring device according to the invention.

With reference to FIG. 1 showing a schematic layout plan of the plasma structuring device SD of a preferred embodiment of the invention, a chemically reactive gas RG is produced from a plasma discharge within a gas reaction chamber GC by means of a radio-frequency electric field fed from a radio-frequency generator GN via a supply line PS. The gas RG is led through a tube NT serving as feeding device for the jet-emitting injection opening OP according to the invention. The reactive gas RG comprises plasma gas from the discharge and/or reactive species produced from the plasma gas. The tube NT terminates in a tapering end forming a fine nozzle NZ in which the inner pipe of the tube emerges in an opening whose lateral dimension is considerably smaller than the length of the pipe and which serves as the injection opening OP.

The shape of the pipe is that of a straight cylinder in the preferred embodiment, but can, in general, be of a more complex shape. In the preferred embodiment, the injection opening OP has an inner diameter d1 of below 1 $\mu$m, through which the reactive gas RG is pressure-emitted as a gas jet of reactive particles. The nozzle NZ is positioned over the surface of the substrate SB delivering the jet—in the following referred to as reactive jet—to the desired locations, where it allows for the local treatment of the substrate. The nature of the treatment depends on the substrate and the chemical composition of the reactive gas. The invention thus makes possible a variety of structuring processes, e.g., local plasma-assisted etching or plasma-enhanced chemical vapor deposition.

The injection opening OP is positioned with respect to the surface SB to predetermined positions, or moves along a predetermined path at a speed appropriate for the required structuring process. For positioning the injection outlet NZ,OP and the substrate SB, piezo-motors are used. Piezo-motors are disclosed in the DE 40 23 311 C2; they comprise shearing piezo-elements working as a drive and a slide defining the direction of motion. The slide is pressed to the piezo-elements by e.g. mechanical or magnetic force; three ball bearings serve as bearing for the slide. Two or three piezo-motors are combined to piezo-motor systems in order to achieve a controlled motion in two directions (lateral, x-y-directions) or three directions (lateral and vertical, wherein vertical means perpendicular to the substrate plane). In the embodiment shown, both the tube NT and the substrate SB are provided with piezo-motor systems NP,SP operated from a translation-positioning control TP controlled via a computer PC. The positioning control TP also serves to control the distance hs of injection opening from the substrate. The piezo-translation system NP of the tube serves mainly for pre-adjusting for operation; during the operation, adjustment of position of the injection opening with respect to the substrate is mainly done through the substrate translation system SP, in order to avoid affecting the injection opening by translation effects during the scanning procedure. The scanning motion is made by means of a piezoelectric translator commercially available from Physik Instrumente Co. (D-76337 Waldbronn, Germany) with a scanning range of 100 $\mu$m lateral and 10 $\mu$m vertical, with a resolution of about 40 nm. The piezo-motors are used for positioning, but not used for scanning because the step size varies, leading to restricted reproducibility.

In order to obtain a higher dynamical range of operation for the substrate positioning, the piezo-elements in the substrate positioning system SP can be replaced by or combined with electric motors. In an example of a combined positioning system, the positioning of the area of the substrate to be structured is first done by means of electric motors, then the fine positioning during structuring within the area is performed using the piezo-positioning systems of the substrate and/or nozzle tube.

The gases are fed into the plasma reaction chamber GC from at least one gas supply GS via gas lines GL controlled by a gas dosing and mixing equipment GE; e.g., three gas lines are shown in FIG. 1. The pressure in the plasma chamber GC is in the range of 5–50 mbar typically, but depends on the plasma reaction desired and can consequently be outside this range as well. The number of gases used depends on the substrate and the type of processing desired and can also vary during the process. In the shown embodiment, plasma excitation by radio-frequency is used; other possible methods are, e.g., a DC discharge or inductive feeding.

It should be noted that according to the invention the chemically reactive species can originate from various kinds of reaction. For instance a purely chemical reaction initiated e.g. by mixing different reactive gases or upon contact of the gas mixture with the substrate is also possible. Thus the gas reaction is not restricted to plasma reactions only, and the invention is not limited to the preferred embodiment as discussed here, in which a plasma reaction is used.

The substrate SB is enclosed in a substrate chamber realized as a vacuum chamber VC which is provided with a pumping system PP for maintaining a vacuum within the vacuum chamber. The vacuum also contributes to the pressure-extracting effect of the injection setup JL in forming the reactive jet; for this the vacuum pressure will be chosen not higher than, but advantageously at least an order of magnitude lower than that in the reaction chamber GC. In the embodiment shown in FIG. 1, the vacuum chamber also encloses the tube NT and its positioning devices. The reaction chamber GC can also be situated in the vacuum chamber VC, so in this case only the gas lines GL and the electrical feed-throughs will cross the chamber walls. The products of the structuring process on the substrate SB are thus continuously removed from the process spot and disposed by known disposal methods; the same applies for those particles of the reactive jet which are scattered from the substrate without undergoing a process reaction with the substrate. Thus, the areas of the substrate located away from the jet are unaffected, due to the collimating effect of the injection pipe for the particle stream, in particular if it is emitted in the molecular-flow regime as discussed below, and the comparatively low pressure around the jet. In order to ensure this, the vacuum pressure in the vacuum chamber VC is advantageously kept at a pressure below the operating pressure of the plasma discharge by at least one order of magnitude, depending on the volatility of the possible process products.

The method used by the applicants to produce the tube NT with the nozzle NZ is pulling of a quartz or glass microcapillary tube by laser-assisted pulling with controlled acceleration as described by Durkan and Shvets in J. Appl. Phys., Vol. 79 (1996), p. 1219. Of course other methods, such as wet etching or microfabrication, could be used for production of nozzle tubes as well. Wet etching methods for capillaries are described, for instance, by van Hulst et al. in Ultramicroscopy, Vol. 42–44 (1992), p. 416 and Pangaribuan et al. in Jap. J. Appl. Phys. Vol. 31 (1992) L, p. 1302.

A longitudinal section of the quartz or glass tube NT is shown in FIG. 2; FIG. 3 displays the corresponding cross-section at a plane denoted by line 1 in FIG. 2. The tube NT is shown with the direction of the gas stream RG running downwards, the nozzle NZ forming the lower end of the quartz tube NT. The inner pipe, used for guiding the reactive gas RG to the nozzle, tapers down from an initial diameter d0 to an injection opening of diameter d1. In the pulled capillary tubes the outer diameter is, for instance, in the region of 150 $\mu$m and the inner diameter d0 in the region of 100 $\mu$m, whereas values of the injection opening d1 of the order of 1 $\mu$m could be attained and diameters of down to about 50 nm are possible. The total length of the tube is typically in the range of several cm. Note that, due to the difference in size scales d0,d1 of the body of the tube and the pipe, the size of the pipe shown in FIG. 2 is not to scale with respect to the tube body; rather, the pipe is depicted too large. The inner pipe reaches the final diameter d1 already at an injection length s1 before the injection end of the nozzle. The gas flow thus forms a gas jet when emitted from the injection pipe. The lateral stability of the gas jet is mainly determined by the ratio between the length s1 and the diameter d1 of the injection pipe. Obviously, with an increase in this number, the jet becomes more focused with a corresponding beneficial result for the size of the smallest features which can be structured. In FIG. 2, a length to diameter ratio s1:d1 of the injection pipe of 8:1 is shown.

The affected area on the substrate depends not only on the length to width ratio s1:d1 but also on the distance hs (see FIGS. 12a and 18) between the injection opening OP and the substrate SB. If, for instance, the distance between the injection opening and the substrate is considerably small, e.g. one tenth, in comparison to the injection width d1, then the length to width ratio has not so much an effect in comparison to the size of the injection opening itself and the s1:d1 ratio can be as low as 1:1. In the case where the opening is at a distance from the substrate of the order of magnitude of its width, a length to width ratio of 5:1 is usually sufficient to create an etching (or deposition, as the case may be) area of the order of magnitude of the outlet width. For higher distances hs with respect to the width of the injection opening d1, however, it is necessary to increase the ratio s1:d1 accordingly. It should be mentioned in this context that for the pulled capillary nozzles described above the length to diameter ratio is well higher than the mentioned ratios of 5:1 or 8:1. It is possible to produce openings serving as injection pipes of a desired length to width ratio s1:d1 by means of known microstructuring methods, in particular in silicon. In this case the ratio possible by means of microstructuring is limited with respect to a maximal value by the aspect ratio that can be achieved by the microstructuring method for the material used; e.g. maximal aspect ratios of 5:1 to 10:1 are possible for silicon with methods known to date. In general the length to width ratio s1:d1 has to be chosen considering the gas throughput and desired directionality for the structuring process used, and thus it can vary in a wide range depending on the application design.

Since the operating pressure in the reaction chamber GC is in the range of 5 to 50 mbar (or, in special cases, even lower), the mean free path of the gas particles is in the range of a few $\mu$m (or even higher), thus it is large compared to the width of the injection pipe for the abovementioned values of the width d1, and the particle current along the injection pipe is of molecular flow type (as described by a high Knudsen number Kn). As shown e.g. by Dayton in Vac. Symp. Trans. (1956). p. 5–11, Pergamon Press, London, provided the particle flow in the pipe is a molecular flow, the angular distribution of the particles ejected from the injection opening is confined to a cone with a small angle around the pipe axis thus forming a particle jet, the width of the angular distribution growing narrower with increasing the ratio between length and width of the injection pipe. Thus, in this regime, the particles will be emitted from the injection opening directly to the substrate surface and project the shape of the injection opening onto the substrate surface.

The concentration of the reactive jet is highly localized at the surface with the size of the resulting processed spot being comparable with the width of the injection opening. The need to maintain short the distance between the injection opening and the substrate surface is caused by the fact that the size of the process spot increases with growing distance. This highly localized size of the reactive jet determines the size of the area where the substrate processing takes place at any time. According to the invention, the reactive jet is delivered from the injection opening OP placed in the direct vicinity of the surface to be processed; the opening is positioned relative to the surface SB to be processed at a distance of the order of or below the opening width. In one of the experiments performed by the applicants, the aperture shield is moved to the desired etching position on the substrate and then brought into contact with the surface of the substrate. In other cases, the distance of the injection opening is controlled using scanning methods as described below, ensuring a near-contact geometry.

In special experimental setups it is desirable to excite the plasma also within the tube NT until a small distance before the injection opening. For this, the tube can additionally be provided with at least two electrodes EL for producing an electric field inside the tube. For example, a radio-frequency field can be applied to the electrodes EL via own power supply lines ES, sustaining a plasma discharge in a like manner as to the plasma chamber GC. In the arrangement the electrodes are running along the sides of the tube. The electrodes EL can be of variable sizes as shown in FIG. 3. Also the distance of the electrodes to the tube and even their shape can vary, not only from electrode to electrode, but also for each electrode along the tube, e.g. in order to modulate the electromagnetic field as desired. Not shown in FIGS. 2 and 3 as well as the following figures, are fixing means, such as spacers or bridges, to maintain the relative position between the electrode assembly and the tube; these fixing means can be of any type known to those proficient in the art.

The electrodes EL are usually separate from the tube NT in order to allow for easy replacement and adjustment of the position. Another possibility is to attach all or a number of the electrodes to the outside of the tube NT, as illustrated by the cross-section shown in FIG. 4; this variant also illustrates the possibility to use only a pair of electrodes DE. The electrodes DE of this type can be formed, e.g., by producing a simple nozzle tube NT with subsequent deposition of the conducting material onto the outer surface to form the electrodes DE. Alternatively the electrodes DE could simply be glued onto the tube surface. The tube with electrodes could also be fabricated using known methods of micromachining.

Another possibility is the inclusion of one ore more electrodes into the inner space of the tube. An example of this variant is shown in FIGS. 5 and 6, where one central electrode ME is inserted along the axis of the tube, acting against a set of outer electrodes SE mounted on a sleeve SL surrounding the tube NT. It should be noted that also here the number of electrodes may vary; for example, in this set-up with a middle electrode ME, the provision of one outer electrode SE, thus forming a coaxial geometry would also be possible. In this arrangement, however, it must be made sure that the center electrode ME is made of or covered with a material resistant to the plasma gases.

It should be noted that in principle, also a single electrode may be used with the nozzle. For instance, the nozzle may be placed inside a microwave waveguide, along which electromagnetic radiation is propagated into the region of the plasma reaction.

In another embodiment the electrodes can be four wires WE incorporated into the wall of the tube NT, a cross section of which is shown in FIG. 7. A nozzle tube of this type can be fabricated from a multicore capillary tube with five holes, i.e. one at the center and four holes around it. Four wires are inserted into the four outer tubes, and the nozzle is formed using a pulling method as described above. To simplify the pulling process and avoid alloying the metal wires with the quartz or glass of the nozzle tube, it is useful to insert the four wires in such a way that they terminate a small distance off the area which is melted during the pull. Thus the electrodes EL will terminate some length from the end of the nozzle NZ, e.g. 1–2 mm. The time required for the gas to travel along this length is negligible compared with the lifetime of the excited reactive gas species.

Figure 8:
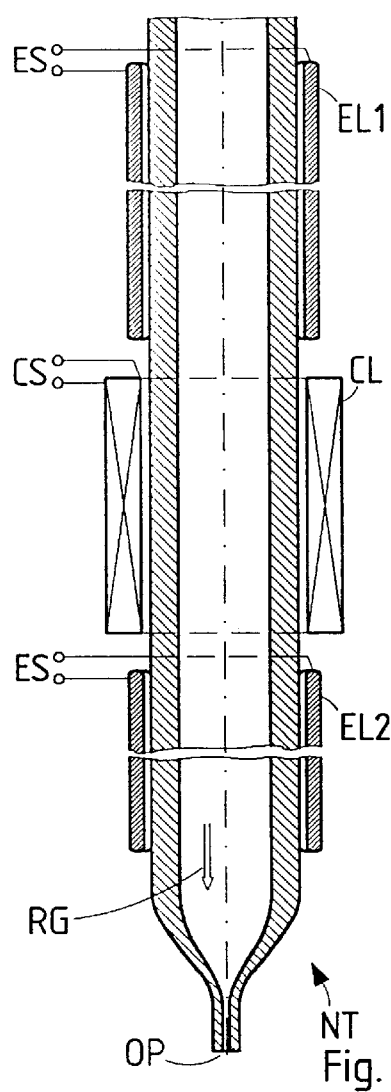
FIG. 8 a longitudinal section of a nozzle tube with a set of subsequent electrodes.

Other electrode arrangements can also be used, for example with other numbers of wires, and/or combinations of the arrangements discussed above. Also a coil assembly CL fed with a DC or AC supply CS, as shown in FIG. 8, producing mainly a magnetic component of an electromagnetic field, could be used. In a further variant, all or a number of the electrodes can reach down to the injection tip, where they can, e.g., be used additionally as scanning tunneling probes for imaging of the structured surfaces.

In order to assist a specifically required plasma reaction, also a set of electrodes, positioned in series along the gas stream can be used as well. An example is shown in FIG. 8, where the tube NT is provided with two electrode systems EL1,EL2 having their respective own supplies ES, and a coil system CL positioned between the electrode systems.

Figure 9:
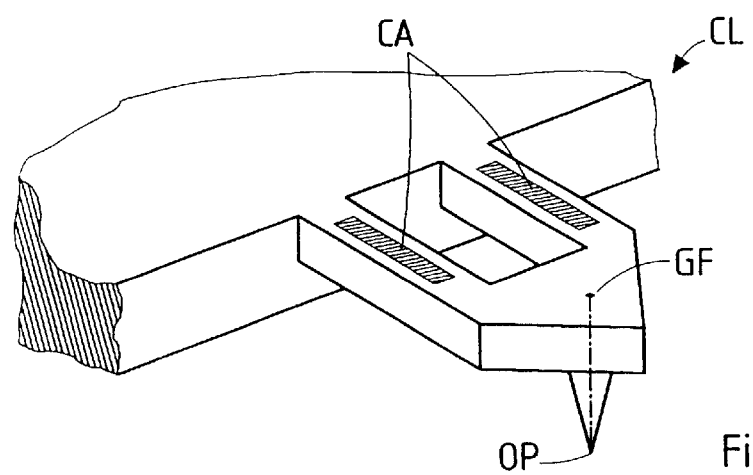
FIG. 9 a further variant of the injection outlet in a cantilever setup.

The materials used for the nozzle tube NT in the preferred embodiment is glass or quartz, which allows for both stability against the reactive gases and rigidity for the use in the positioning and distance control device. However, the invention is not limited to these materials. For example, it could also be made of a polymer. FIG. 9 shows a possible alternative design for a injection outlet which is placed at the end of a cantilever CL formed out of silicon, surface-covered by silicon oxide. The injection opening OP is positioned at the end of a feeding pipe GF, which plays the role of the tube in the cantilever. Devices of this type can be formed by known microfabrication methods, as mentioned above, with predefined length and cross-section shape. The distance control is possible by measurement of, e.g., the distortion of the cantilever by means of piezo-resistive elements provided in the cantilever arms CA.

It should be noted that for many applications, it may not be necessary to excite a plasma within the tube NT, and the plasma is confined to the plasma chamber GC and possibly the extraction system feeding the tube, whereas only reactive particle species RG from the plasma reaction with a longer life-time are led through the tube and emitted in the reactive jet. In these cases also a tube without electrodes, manufactured from a single-capillary tube, can be used. In order to decrease the time interval between the excitation of the reactive species RG and the emission via the injection pipe and reduce the 'passive' volume in the pipe system between the reaction chamber GC and the injection opening OP, the reaction chamber GC will have to be located as near to the opening as required by the life-time of the species involved. This measure also serves to reduce the number of collisions of the reactive particles with the walls, as these collisions may reduce the chemical reactivity of the plasma.

Figure 10:
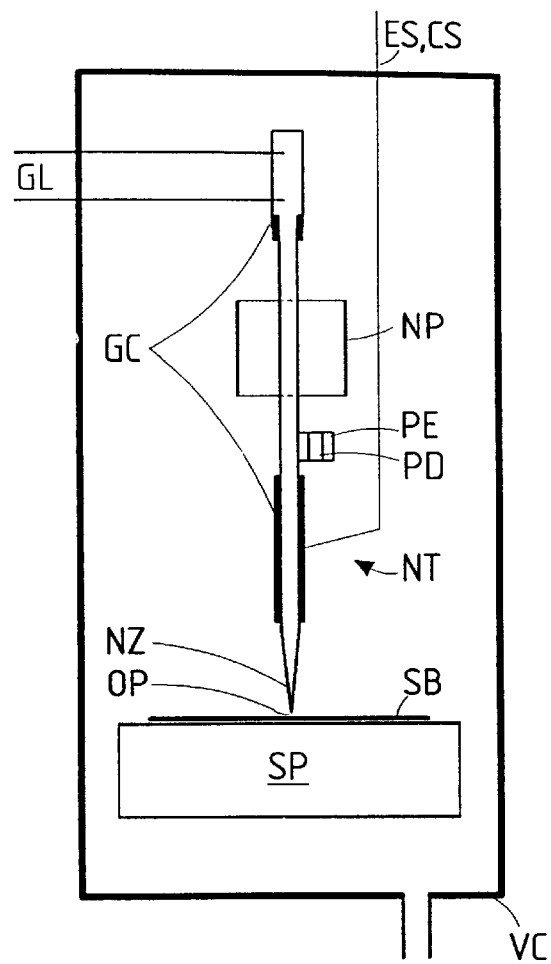
FIG. 10 the setup of the vacuum and gas reaction chambers of a second embodiment of the invention.

Another variant of the invention operates without a distinct reaction chamber GC. Instead, the tube NT itself, or specific parts of the tube, can serve as a reaction chamber in a set-up where the gas lines directly feed the tube NT. In this case, the whole excitation process including mixing of gases (if more than one reaction gas is used) and the plasma reaction occurs within the glass tube, leading the reactive gas to the end of the tube with the injection opening OP. An example of an embodiment of this kind is shown in FIG. 10, in which only the vacuum chamber VC incorporating the reaction chamber GC is shown. The tube NT in this embodiment is, for instance, the one shown in FIG. 8. With respect to the other components not shown in FIG. 10 (such as the gas supply GL, the power input from the generator GN, as well as the controlling elements and connections for positioning discussed below), FIG. 10 corresponds to FIG. 1.

It should be noted that the width d 1 of the injection opening is not restricted to the sizes given above; rather, for other applications the width may be chosen also far wider, e.g. in the range of 100 $\mu$m or above, as long as the other process parameters, like the pressure in the gas feeding pipe are adjusted accordingly to the invention.

The shape of the injection opening OP of the nozzle NZ will generally be chosen circular, in order to avoid effects of orientation. However, for special applications the opening shape can take any extended form. For example, a line-shaped opening can be used to create grooves or gratings in a single step; the line need not be straight but can be bent or zigzag-shaped if useful. In a like manner, the shape of the opening can have any shape according to the desired structure(s) to be formed.

FIG. 11 shows the schematic layout of another preferred embodiment of the invention. Only the components in the vacuum chamber VC of this structuring device SD is shown; with respect to the components not shown in FIG. 11 (such as the gas supply GL, the reaction chamber GC etc.), FIG. 11 corresponds to FIG. 1. The reactive gas RG is led through a tube NT serving as feeding device for the injection outlet JL producing a jet of reactive gas through at least one injection opening OP according to the invention. In this embodiment, the tube NT ends with a gas-feed tube terminating in the injection outlet JL according to the invention; the injection outlet JL of this embodiment corresponds to the nozzle setup NZ,OP of the first embodiment shown in FIG. 1. FIGS. 12 and 13 show the injection outlet JL comprising the end of the gas-feed tube FT and an affixed aperture shield AS in an oblique view and a longitudinal section along the axis of the gas-feed tube, respectively.

During the operation the aperture shield AS is positioned in an operation position above a substrate SB. In the aperture shield, at least one hole is formed as a conduit for the reactive gas towards the substrate SB which is positioned below the aperture shield. FIG. 12a shows a longitudinal section of this conduit, which serves as injection pipe according to the invention. As can be seen from FIG. 12a, the injection pipe emerges in an injection opening OP with lateral dimension d1. The injection opening OP has a width d1 of the order of, e.g., a few $\mu$m, through which the reactive gas RG is pressure-emitted as a gas jet. The shape of the injection pipe is that of a straight line in FIG. 12a, but can, in general, be of a more complex shape. In the preferred embodiment, the aperture shield is made from a silicon wafer having a thin membrane of a thickness of about 3 μm, and the injection pipe is realized as an opening traversing the mask membrane. Thus, the length s1 of the injection pipe is equal to the thickness of the mask membrane. To passivate the membrane including the injection opening against the reactive gases, its surfaces are covered with a resistant layer. For passivating a silicon wafer mask, for instance, the applicants used a coating of alternating 30 nm thick chromium and gold layers which were vapor-deposited to the mask; the total coating had a thickness of approximately 180 nm. In the case of the shield means AS realized as a mask membrane, the length to diameter ratio s1:d1 is in the range of 1:1 or above.

As already discussed above, the injection opening OP is positioned with respect to the surface SB to predetermined positions, or moves along a predetermined path at a speed appropriate for the required structuring process.

The applicants have found that in certain cases for operating with a desired plasma reaction, e.g. a $SF_6/O_2$ plasma for silicon etching, it is difficult to maintain a high etching rate on the substrate upon reducing the total gas flow for the gas reaction in the plasma chamber GC to a flow value as determined by the size of the injection opening(s) OP. This is easy to understand since gas pressure and gas flow determine the excitation and transport of the etchant gas species, and the optimal conditions of reaction for a given plasma chamber geometry may require gas flows distinctly higher than those sustained by the minute injection opening dimensions. Therefore, a plasma reaction is used at parameters which produce satisfying etching rates (or depositing rates, as the case may be) for macroscopic processing (i.e., processing of areas in the range of $mm^2$ or greater). For instance, with the $SF_6/O_2$ plasma already mentioned, a flow of 3 sccm was used for each of the two gases (sccm= standard cubic centimeter per minute) with a plasma reaction maintained by an rf microwave power of 70 W. The reactive gases were led through a gas-feed tube of 2.6 mm inner diameter. In order to increase the total gas flow to the value optimal for the reaction chamber, at least one escape opening is made at the injection outlet. This allows the surplus gas to flow into the substrate chamber where it is then pumped off. The flow of the reactive gas RG is therefore split into two parts at the injection outlet: an active flow through the injection pipe which is used for the desired sample processing and the surplus part which does not participate in the sample processing and only serves to maintain correct conditions in the reaction chamber.

In the embodiment shown in FIG. 12, four slots LS serving as escape openings are formed at the end of the gas-feed tube FT. FIG. 14 shows a cross-section through the gas-feed tube FT along the plane 14 of FIG. 12. The escape slots LS ensure that the gas flow can be chosen independent of the size of the injection opening used, and the structuring device SD can operate at constant total gas flow even with varying injection geometries resulting in varying active gas flows through the injection openings.

The gas escaping through the escape openings LS,h1 either arrives in the vacuum chamber and is pumped off together with the process products, or are collected by means of a recycle system in order to re-use the diverted gases.

Figure 15:
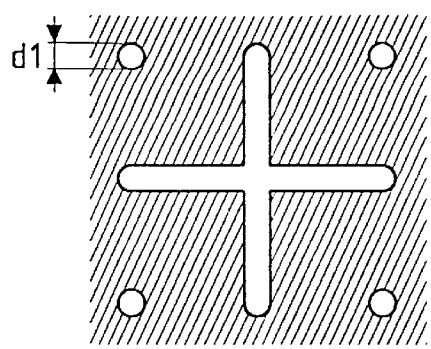
FIG. 15 the aperture pattern of the aperture shield of FIGS. 12 and 13.

FIG. 15 shows a complex shaped aperture geometry formed in the 3 μm thick membrane of a silicon open-stencil-mask used by the applicants for testing the invention. The aperture pattern is a cross with four dots arranged in a square of about 30 μm size, and the width d1 of the opening of the dots and lines is 3 μm. The stencil mask was fabricated employing known methods of stencil-mask production; as already mentioned, the mask surfaces were Cr/Au-covered before use.

In the etch test, the applicants used silicon wafers as substrate. After an etch process of 10 min with the above $SF_6/O_2$ plasma, a pattern corresponding to the aperture pattern was etched into the substrate. The pattern had a depth of approximately 2 μm. The profile across an etch line had a 'Gaussian' shape whose width, measured between opposite points of half maximum etch depth, equals the width of the apertures, i.e. 3 μm. This shows that it is possible to achieve etch rates of at least 100 nm/min for structures of this size. It should be noted that in these experiments the applicants used a "gentle" plasma process in order to avoid potential damage to the mask membrane used as aperture shield, and therefore, the applicants trust that etching rates considerably higher are feasible.

Figure 16:
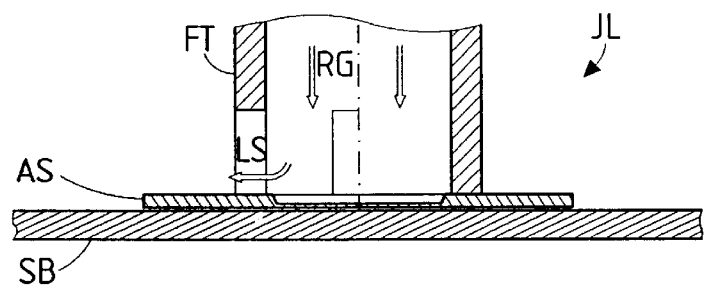
FIGS. 16 and 17 two further variants of the injection outlet.

In the injection outlet JL shown in FIGS. 12 and 13 which was used for the etch tests by the applicants, the aperture shield AS is attached, e.g. glued, to the gas-feed tube FT in the membrane area. FIG. 16 shows a variant of the injection outlet JL in which the aperture shield AS is affixed to the gas-feed tube FT along its frame rather than on the membrane as with FIG. 12. While this injection setup variant obviously has a greater mass of the aperture shield, it has a higher dimensional stability due to the robust mounting.

Figure 17:
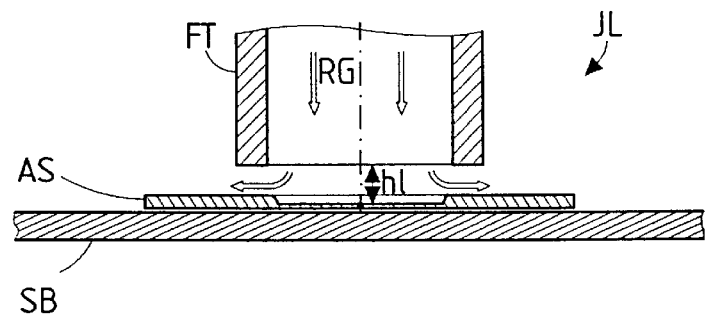

FIG. 17 shows another variant wherein the gas-feed tube FT is not provided with escape slots; rather, the aperture shield AS is mounted at a fixed distance h1 to the outlet of the gas-feed. In this variant, the gap between the shield AS and the gas-feed FT represents the escape opening for the surplus gas flow. The aperture shield AS is held in a fixed position with respect to the gas-feed tube FT by means of a set of jibs, not shown in FIG. 17.

Figure 18:
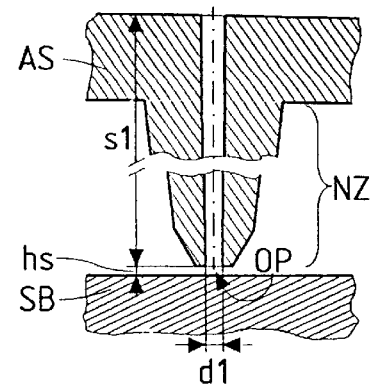
FIG. 18 a longitudinal section of the injection pipe of another variant wherein the injection pipe runs along a projecting nozzle.

If it is desired to enlarge the space between the aperture shield AS and the substrate SB, it is advantageous—in order to keep low the distance hs between the injection opening OP and the substrate SB, to realize injection pipes within a nozzle which projects from the aperture shield AS towards the substrate. A nozzle NZ of this kind is shown in FIG. 18. The nozzle NZ can thus have a length several times the thickness of the shield membrane or more; simultaneously and as a further advantage, the length to width ratio s1:d1 is also improved. The nozzle NZ can be made from the same material as the aperture shield. Alternatively, the nozzle can be a separately produced nozzle, such as a quartz or glass micro-capillary tube as discussed above with FIGS. 2–8, mounted to the appropriate place of the shield AS.

Figure 19:
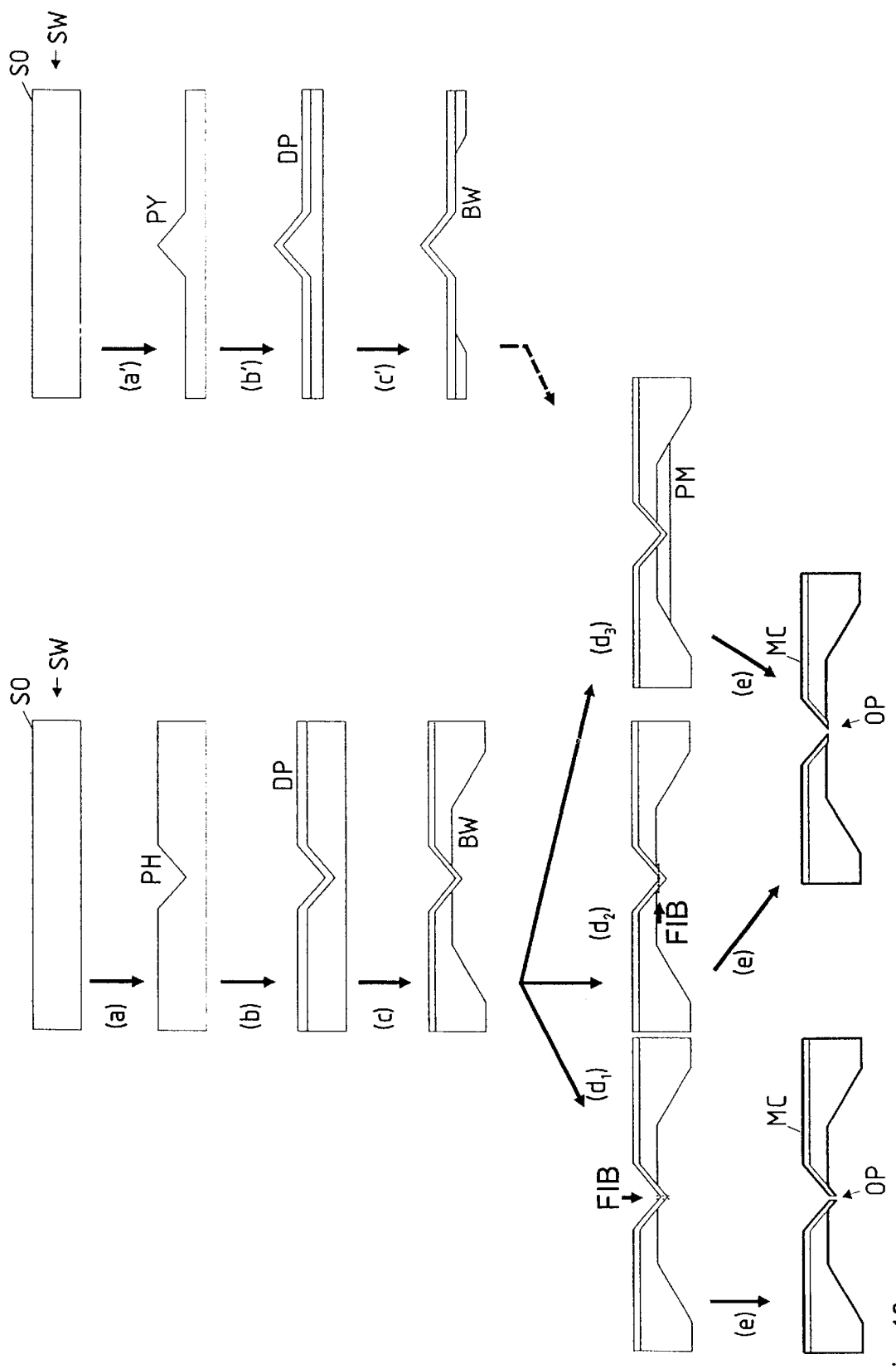
FIG. 19 a wafer flow process for producing a nozzle by silicon technology.

One method of producing a silicon membrane having a nozzle suitable for a structuring device according to the invention, in particular with the geometry of FIGS. 12, 16 and 17, is illustrated in FIG. 19. This method starts from an n-doped 100 silicon wafer SW whose front surface was oxidized and thus is coated with a thin $SiO_2$ layer SO of e.g. 1–2 μm. Using a lithographic step for defining the position of a window, a square pyramidal hole PH is etched into the oxide—step (a). The etch is performed, for instance, by means of a KOH (potassium hydroxide) wet-etch process at suitable conditions such that the etch process stops at defined crystallographic planes, in this case the 111 plane, and thus, pyramidal holes of square base shape are formed. The plane where the KOH etch stops depend on the etching conditions chosen; the base shape is determined by the orientation of the monocrystalline wafer and the etch stop planes. Another well-known possibility is an etch stop at the 338 plane, which results in even steeper sides of the resulting pyramide and, therefore, is even more advantageous. If multiple apertures are desired, then a number of windows are defined in the lithographic step and a corresponding number of pyramidal holes is formed in the wet-etch step.

As a next step (b), boron—or another p-dopant—is brought into the silicon front surface by means of common diffusion techniques. The boron-doped layer DP thus produced is, for instance, 3–5 $\mu$m thick. Due to p-doped layer, a pn-junction is created 3–5 $\mu$m under the surface.

In an electrochemical wet etching step (c), the backside of the wafer is etched with KOH while a voltage is applied to the pn-junction. The backside etching BW of the bulk silicon stops at the depletion zone (electrochemical etch stop). Thus, a hollow pyramide remains, whose wall thickness is about the diffusion depth of the preceding boron-diffusion process.

In the next step (d), an aperture is formed at the tip of the pyramide. This aperture which is to serve as injection pipe according to the invention can, for instance, be generated by FIB hole milling by means of a vertical focused ion beam ($d_1$). By this method, an aspect ratio of about 5:1 to 10:1 can by obtained, depending on the beam quality. Another possible method is FIB cutting of the tip ($d_2$), wherein the massive end of the tip is cut off by means of a horizontal focused ion beam which is aligned so as to create only a small opening. The aspect ratio thus obtained is small, in the order of 1:1, but can be improved by plasma etching of the edges, preferably anisotropic plasma etching, leading to steep sidewalls. A further possibility employs deposition of a polymer and subsequent polish ($d_3$). The polymer is, for instance, deposited in the backside window. Subsequently the polymer layer is polished until the tip of the pyramid is removed. After removing the polymer layer, e.g. by an oxygen plasma or acetone solvent, the resulting aperture corresponds to that produced by FIB cutting ($d_2$).

As a final step (e), a metal coating MC is deposited on the surfaces of the structured silicon wafer. This protective layer of e.g. 300–500 nm thickness is necessary to preserve the Si pyramid membrane from being etched by the reactive gases. The layer is preferably a stress-compensated multilayer structure, for instance a Cr/Au multilayer, and can be produced by vapor or galvanic deposition. The deposition of the metal layer advantageously decreases the lateral width of the aperture OP, thus improving the aspect ratio of the injection pipe produced.

It is also possible to produce an elevated pyramide PY in the initial KOH wet-etch step (a'). For this variant, the lithographic step is chosen such that the front surface oxide is etched with the exception of only one (or more) oxide square, which defines the place of the pyramide. The subsequent steps (b',c', . . . ; in the wafer flow shown in FIG. 19, the wafer is turned over after step c') correspond to those described above with the pyramidal hole geometry, resulting in a silicon nozzle as with the above wafer-flow (a–e).

Since the components of the injection outlet used in the process are fragile, the device is provided with a feedback system to maintain the distance between the injection opening OP and the surface comparable or smaller than d1 during the movement of the injection outlet JL or the tube NT. If the separation were allowed to vary during the processing, the size of the process spot would change in an uncontrolled manner and cause the size of the smallest features to increase.

Advantageously, the tip of the nozzle NZ shown in FIGS. 2–8 or 18 can be used as a scanning probe in a structuring device SD together with a surface scanning microscope setup using, e.g., shear-force detection, atomic force, tunneling or magnetic interaction with the substrate surface. The choice of the surface scanning methods depends on the material to be processed and/or its properties. Thus the nozzle NZ simultaneously acts as a reactive jet emitter and a scanning probe for imaging with high resolution. It is also possible to use a projecting tip which is provided in the vicinity of the injection openings but which itself does not have an injection opening, as scanning probe.

The methods for distance control are mostly taken over from scanning probe techniques, primarily scanning near-field optical microscopy (SNOM) where the shear-force damping is generally used. This technique can yield resolutions in the range of down to 10 nm, as shown by Durkan and Shvets in J. Appl. Phys., Vol. 79 (1996), p. 1219. The nozzle is oscillated laterally, i.e. parallel to the surface to be probed, near one of its mechanical resonance frequencies with an amplitude in the order of 10 nm. The vibrations are excited by means of, e.g., a piezo-element PE connected to an AC generator OS; the oscillation amplitude and/or phase are monitored by a shear force detection system PD,PA. At a distance of a few nanometers from the surface, the oscillations become damped out by shear-force interactions between the tip of the nozzle NZ and the surface SB. This damping, or equivalently the amplitude and/or the phase of the vibration at the resonance frequency is measured to derive the desired distance information.

Oscillating probes for surface scanning are disclosed e.g. by Guithner et al., Appl. Phys. B, Vol. 48 (1989), p. 89 (of which the essential parts of disclosure are also contained in the DE 38 20 518 C1 of one of the inventors), by Karrai et al., Appl. Phys. Lett., Vol. 66 (1995), p. 1842 (of which the essential parts of disclosure are also contained in the DE 195 10 368 A1) and by Michels et al. in Thin Solid Films, Vol. 264 (1995), p. 172. The DE 195 02 822 A1 teaches the use of piezo-elements for generating the oscillation, for which a further device is presented by Barenz et al. in Rev. Sci. Instrum., Vol. 67 (1996), p. 1912. The use of two piezo-elements for separate excitation and detection of oscillations is described by Brunner et al. in Rev. Sci. Instrum., Vol. 68 (1997), p. 1769.

For the detection of the oscillation of the nozzle, several methods as known from the state of the art can be used. A preferred method uses a so-called bimorph piezo comprising two piezo-elements PE,PD directly glued together, the whole bimorph together with the nozzle serving as a mechanical resonator which is controlled electronically. The frequency range of the mechanical resonator should cover the resonance frequencies of the nozzle oscillations and typically lie in the range of a few kHz up to several tens of kHz. One element PE is connected to the generator and excites the nozzle oscillations; the other is used as a pick-up PD and is connected to a phase-sensitive amplifier-detector PA. The output of the detector is used for the correct positioning of the nozzle NZ and the substrate SB during positioning in the course of the structuring process.

Another possible method is optical detection of the oscillations. In this case, the laterally oscillated nozzle chops a laser beam coming from, e.g., a separate detection optical fiber perpendicular to the nozzle. The resulting modulated light beam is detected with, for instance, a photodiode. As compared to the piezo-controlled detection, the optical method is more difficult to handle and it has the disadvantage of sensitivity to scattered light and comparatively expensive adjustment. Further details of this method are discussed by Durkan and Shvets in J. Appl. Phys., Vol. 79 (1996), p. 1219, J. Appl. Phys., Vol. 80 (1996), p. 5659, and Applied Optics, Vol. 36 (1997) 31, p. 8173. Also interferometric detection is possible, offering a greater sensitivity. However, such a set-up is intricate to calibrate and use.

Shear force detection is preferred since it requires vibration of the nozzle parallel to the substrate surface, resulting in smaller interaction forces and lower stress on the nozzle as compared with a perpendicular vibration. In atomic force microscopy the direction of oscillation is perpendicular to the surface and the lateral resolution is higher.

An implementation of the nozzle positioning system NP using electric motors is also a possible variant, though seems less appropriate. It should be noted in this context that, in a set-up with the gas reaction chamber GC outside of the vacuum chamber VC, the feed-through for the reactive gases through the wall of the vacuum chamber VC may restrict the movement of the nozzle tube NT which is possible without breaking the tube, lest a complex construction of the feed-through becomes necessary. For a rather small movement of the nozzle tube in the range of micrometers, the elasticity of the nozzle tube and commercial feed-throughs allows for a restricted range of movement, which is used for the scanning oscillations and the scanning adjustment movements of the injection outlet.

One further advantage of the integrated structuring and imaging is the lower demands on the flatness of substrates to be processed. By in-situ imaging, it is possible to follow the height profile of a substrate provided the lateral speed of movement allows for correction of vertical distance. For the same reason, it is also possible to produce structures of possibly large vertical profile.

To avoid cross effects of the surface processing on the scanning procedure and vice versa, it is further possible to pulse the plasma reaction. Plasma pulsing also allows for implementing special cases of plasma processing. For this, a pulse generator BG produces a blanking signal which triggers the rf generator GN such as to chop the plasma power supply. The blanking signal can, e.g., be a rectangular wave signal with duty ratio chosen appropriately, but may be more complex if necessary. The same signal, possibly with a time delay in order to allow for the propagating velocity of the gas in the tube, is used by the translation-positioning control TP. Thus surface scanning as well as repositioning between separate points to be structured can be performed in the pauses of the surface processing. The pulsing frequency has to be chosen with respect to both the life-time of the reactive gas species and the time needed for performing the surface scanning, and will thus be in the range of a few Hertz, e.g. 10 Hz.

For reasons of process speed, the size of the injection opening should match the size of the structures to be produced. If structures of different size are desired, the injection opening may need to be moved several times above some areas. Another strategy is to use a set of injection openings having different sizes and/or shape as appropriate for the respective structuring. A set of injection openings, e.g. of different materials, may also be needed if a plurality of process steps is to be used which cannot be implemented on a single type of injection opening.

Moreover, a plurality of openings can be used to produce a set of structures on the substrate in parallel, offering additional process flexibility. The multiple openings may all have the same or different shape, and may be placed on one gas-feed tube (compare FIG. 15) or feeding pipe. Each opening or a group of openings can also reside on a set of tubes. A possible application for an arrangement with a plurality of openings according to the invention is the printing of structures onto the substrate surface. For such a printing arrangement, the lateral positioning of the substrate can be used merely for correct adjustment with respect to the desired position on the substrate surface, or can be used in a combination of printing and scanning along the substrate surface. Another potential application of a device with, e.g., an array of nozzle tubes can be processing the die fields of a substrate wafer with identical structures in parallel.

Figure 20:
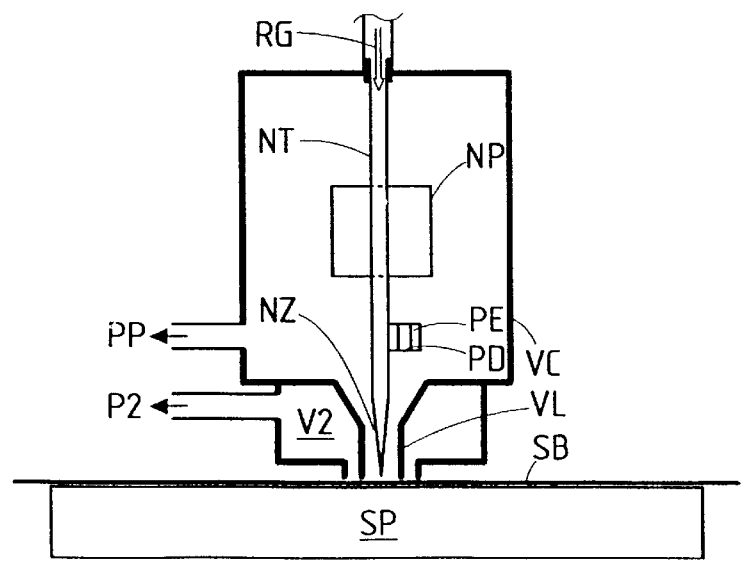
FIG. 20 a further embodiment of the invention allowing structuring "on air".

In the above-discussed embodiments of the invention, the substrate SB is positioned within the vacuum chamber VC. If, e.g., the substrate is large or it is impractical to procure a vacuum as needed for extracting the reactive jet around the entire substrate which may be for instance a large biological surface, it is favorable that only a small portion of the substrate is exposed to vacuum conditions. FIG. 20 shows the vacuum chamber and substrate setup of an embodiment wherein the major part of the substrate can remain at gas conditions different from those in the vacuum chamber, e.g., at ambient pressure. The vacuum chamber VC comprises a leg VL which surrounds the lower part of nozzle tube NT and ends above the substrate SB. The leg VL ends in an opening adapted to be covered by the substrate which is mounted outside the substrate chamber, and the nozzle NZ is situated so that it can be positioned through the opening at the region of the substrate surface covering the opening of the leg VL. The substrate is positioned with respect to the leg VL by means of the substrate stage SP, whereas the nozzle NZ is fine positioned within the vacuum leg.

A gap between the substrate and the vacuum leg is maintained during operation. The width of the gap is small enough so as to achieve the vacuum conditions suitable for structuring by means of the reactive jet, but is sufficiently large to ensure that the substrate surface structures do not get into contact with the rim of the leg during positioning of the substrate by means of the substrate stage SP. Typical values of the gap width are several $\mu$m, e.g. 10–20 $\mu$m. Control of the gap width is performed in a like manner as control of the positioning of the nozzle tip over the substrate.

The apparatus of FIG. 20 makes use of the well-known technique of differential pumping used for connecting recipients held at different gas pressures. The pressure gradient between the main vacuum chamber VC and the atmosphere around the substrate is partitioned by providing at least one additional recipients V2 held at an intermediate pressure which forms a sleeve around the leg VL of the main chamber. For instance, the pressure within the main chamber VC may be $10^{-4}$ mbar, whereas the pressure in the intermediate chamber V2 is $10^{-1}$ mbar.

Both recipients VC,V2 are pumped off by respective pumping means PP,P2. There may be more than one intermediate chambers, forming e.g. concentric sleeves around the vacuum leg of the main vacuum chamber VC. If needed, the substrate my be positioned within an own chamber (not shown in FIG. 20) held at specific conditions of gas atmosphere and pressure.

What is claimed is:

1. Structuring device for processing a surface of a substrate, comprising a substrate chamber for mounting the substrate and a reaction chamber enabling a gas reaction at a given operating pressure, the reaction chamber having at least one gas inlet for a reaction gas and at least one injection outlet leading into the substrate chamber, characterized in that the substrate chamber is provided with a pumping system for maintaining a vacuum within the substrate chamber at a pressure not above the operating pressure of the gas reaction in the reaction chamber, the injection outlet is provided with at least one injection pipe ending into an injection opening of given width, the injection pipe having a length not smaller than the width of the injection opening, the injection pipe forming gas particles originating from the gas reaction into a molecular-flow gas jet streaming out of the injection opening, and the injection outlet and/or the substrate are provided with a positioning means for positioning the injection opening with respect to the substrate surface at a height of the order of or below the width of the opening as measured along the axis of the injection pipe.

2. Structuring device according to claim 1, characterized by a shield means positioned at the injection outlet and at least one injection pipe traversing the shield means.

3. Structuring device according to claim 2, characterized in that the shield means is positionable by means of the positioning means at contact with the substrate.

4. Structuring device according to claim 1, characterized in that the injection outlet comprises at least one projecting nozzle through which the injection opening emerges.

5. Structuring device according to claim 4, characterized in that the injection outlet is a tube terminating in a tapering end forming a nozzle through which the injection opening emerges.

6. Structuring device according to claim 4, characterized in that the projecting nozzle is provided with at least one electrode, for producing an electromagnetic field inside the tube.

7. Structuring device according to claim 1, characterized in that the injection outlet comprises at least one escape opening leading into the substrate chamber away from the substrate.

8. Structuring device according to claim 1, characterized in that the length of the injection pipe is greater than the injection opening width by a ratio of at least 5:1.

9. Structuring device according to claim 1, characterized in that the reaction chamber is a plasma reaction chamber equipped for sustaining a plasma discharge.

10. Structuring device according to claim 1, characterized in that the gas jet contains chemically active particles produced by the gas reaction from the at least one reaction gas.

11. Structuring device according to claim 1, characterized in that the injection outlet and/or the substrate are provided with a scanning means for scanning the injection opening relative to the substrate over the substrate surface.

12. Structuring device according to claim 1, characterized in that the pumping system is designed to maintain the vacuum in the substrate chamber at a pressure below the operating pressure of the gas reaction in the reaction chamber by at least one order of magnitude.

13. Structuring device according claim 1, characterized in that the gas reaction is pulsed.

14. Structuring device according to claim 13 characterized in that the pauses of the pulsed gas processing are used for positioning and imaging of the sample.

15. Structuring device according to claim 1, characterized in that the reaction chamber is located inside the substrate chamber.

16. Structuring device according to claim 1, characterized in that the substrate chamber is provided with an opening adapted to be covered by the substrate being mounted outside the substrate chamber.

17. Structuring device according to claim 16 characterized in that the opening of the substrate chamber is provided with a positioning means to position the substrate to maintain a predetermined gap width between the substrate surface and said opening, and in that said opening is further provided with at least one surrounding sleeve provided for being pumped off to a pressure intermediate between the pressure within the substrate chamber and the ambient pressure surrounding the substrate.

18. Structuring device according to claim 1, characterized in that the injection opening is used as a scanning probe of a surface scanning microscope to control the distance of the injection opening with respect to the substrate surface.

19. Structuring device according to claim 18 wherein the surface scanning microscope is realized as an atomic-force or shear-force scanning microscope.

* * * * *